United States Patent
Kobayashi et al.

(10) Patent No.: US 9,257,259 B2
(45) Date of Patent: Feb. 9, 2016

(54) ELECTRON BEAM IRRADIATION METHOD AND SCANNING ELECTRONIC MICROSCOPE

(75) Inventors: Kinya Kobayashi, Hitachi (JP); Toshiyuki Yokosuka, Hitachinaka (JP); Chahn Lee, Hitachinaka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 139 days.

(21) Appl. No.: 13/807,577

(22) PCT Filed: Jun. 8, 2011

(86) PCT No.: PCT/JP2011/003214
§ 371 (c)(1),
(2), (4) Date: Apr. 10, 2013

(87) PCT Pub. No.: WO2012/001883
PCT Pub. Date: Jan. 5, 2012

(65) Prior Publication Data
US 2013/0187045 A1    Jul. 25, 2013

(30) Foreign Application Priority Data
Jun. 30, 2010    (JP) .................... 2010-148463

(51) Int. Cl.
*H01J 37/28*    (2006.01)
*H01J 37/147*    (2006.01)
*H01J 37/244*    (2006.01)

(52) U.S. Cl.
CPC .............. *H01J 37/28* (2013.01); *H01J 37/147* (2013.01); *H01J 37/244* (2013.01); *H01J 2201/025* (2013.01); *H01J 2237/24592* (2013.01); *H01J 2237/281* (2013.01)

(58) Field of Classification Search
CPC .............. H01J 37/026; H01J 2237/004; H01J 2237/0041
USPC .................................. 250/307, 310
See application file for complete search history.

(56) References Cited

U.S. PATENT DOCUMENTS 5,302,828 A    4/1994    Monahan
7,187,345 B2    3/2007    Kobaru et al.

(Continued)

FOREIGN PATENT DOCUMENTS

JP    08-506685 A    7/1996
JP    09-180667 A    7/1997

(Continued)

OTHER PUBLICATIONS

International Search Report mailed Sep. 20, 2011 issued in corresponding International Application No. PCT/JP2011/003214.

*Primary Examiner* — Jack Berman
*Assistant Examiner* — Kevin Chung
(74) *Attorney, Agent, or Firm* — McDermott Will & Emery LLP

(57) ABSTRACT

Provided is an electron beam scanning method for forming an electric field for appropriately guiding electrons emitted from a pattern to the outside of the pattern, and also provided is a scanning electron microscope. When an electron beam for forming charge is irradiated to a sample, a first electron beam is irradiated to a first position (1) and a second position (2) having the center (104) of a pattern formed on the sample as a symmetrical point, and is then additionally irradiated to two central positions (3, 4) between the first and second irradiation position, the two central positions (3, 4) being on the same radius centered on the symmetrical point as are the first and second positions. Further, after that, the irradiation of the first electron beam to the central positions between existing scanning positions on the radius is repeated.

10 Claims, 8 Drawing Sheets

(56) References Cited

U.S. PATENT DOCUMENTS

| | | | |
|---|---|---|---|
| 2005/0045821 A1* | 3/2005 | Noji et al. | 250/311 |
| 2005/0263715 A1* | 12/2005 | Nakasuji et al. | 250/396 ML |
| 2007/0024528 A1 | 2/2007 | Kobaru et al. | |
| 2007/0194229 A1* | 8/2007 | Okuda et al. | 250/310 |
| 2008/0116375 A1* | 5/2008 | Ikegami et al. | 250/307 |
| 2009/0084954 A1* | 4/2009 | Ezumi et al. | 250/307 |
| 2013/0037716 A1* | 2/2013 | Tadaka | H01J 37/026 250/307 |

FOREIGN PATENT DOCUMENTS

| | | |
|---|---|---|
| JP | 2007-059370 A | 3/2007 |
| JP | 2008-123716 A | 5/2008 |
| JP | 2009-099540 A | 5/2009 |

* cited by examiner

FIG. 9
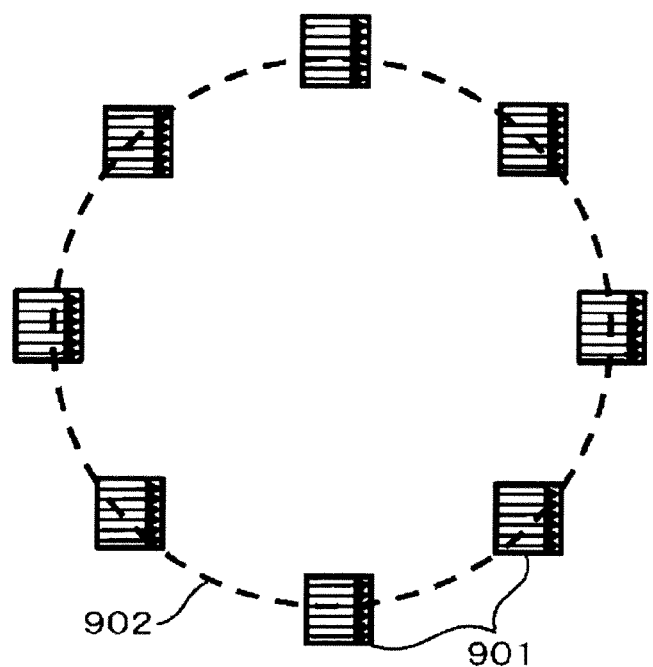
(a)
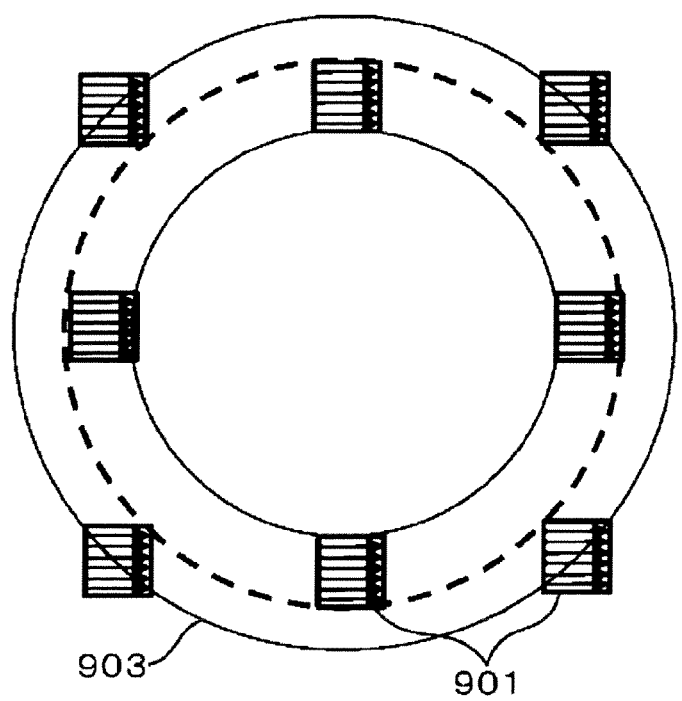
(b)

ELECTRON BEAM IRRADIATION METHOD AND SCANNING ELECTRONIC MICROSCOPE

RELATED APPLICATIONS

This application is the U.S. National Phase under 35 U.S.C. §371 of International Application No. PCT/JP2011/003214, filed on Jun. 8, 2011, which in turn claims the benefit of Japanese Application No. 2010-148463, filed on Jun. 30, 2010, the disclosures of which Applications are incorporated by reference herein.

TECHNICAL FIELD

The present invention relates to a charged particle ray apparatus such as a scanning electron microscope and, more particularly, to a method of preliminary scanning and an apparatus for the preliminary scanning in which a sample surface is charged before pattern measurement or inspection.

BACKGROUND ART

In recent years, with the increase in integration of semiconductor elements and with the development of finer semiconductor elements, a wide variety of patterns has been formed on samples (e.g., semiconductor wafers) and the importance of evaluations and measurements of the shapes and the sizes of them has increased markedly. Regarding contact holes, which provide conduction between layers on semiconductor wafers in a multilayer construction, and deep grooves or the like formed between patterns, in particular, the hole diameters and the widths of the grooves become extremely small with miniaturization and the aspect ratio (the depth of holes or the like divided by the diameter (width) of holes or the like) tends to increase.

In order to perform inspection or measurement of bottom portions of such contact holes or the like, detection of secondary electrons excited by a bundle of primary electron rays (which may be referred to as "electron beam" hereinafter) is necessary; however, with the increase in aspect ratio, secondary electrons are more likely to impinge on the side wall of a hole and become extinct in the hole, making it difficult to inspect or measure the bottom of the hole. In Patent Literature 1, a technique to attach positive charge on a sample surface for forming an electric field for guiding electrons emitted from the bottom of a hole to the outside of the hole (referred to as "predosing" or "preliminary irradiation" in some case hereinafter) is proposed. More specifically, a technique to irradiate a sample region including a pattern of a hole or the like with a beam for charging a sample is described. In particular, a technique to separately perform predosing a certain number of times for forming a suitable surface electric field is described in Patent Literature 1.

In Patent Literature 2, a technique to perform interlaced scanning with a beam at the time of predosing so as to avoid a bias of charging in the area scanned with the beam is described. Interlaced scanning enables mitigation of the local bias of charging in the area scanned with the beam and guiding secondary electrons from holes to the outsides of the holes with improved efficiency.

CITATION LIST

Patent Literature

Patent Literature 1: JP-A-2009-99540 (the corresponding US Patent Application Publication US2009/0084954)

Patent Literature 2: JP-A-2007-59370 (the corresponding US patent U.S. Pat. No. 7,187,345)

SUMMARY OF INVENTION

Technical Problem

According to a predosing method such as described in Patent Literature 1, a large amount of secondary electrons can be guided out of a hole and the efficiency of detection of electrons emitted from the bottom of the hole can be remarkably improved; however, it is conceivable that, when a bias of charging occurs in the area scanned for predosing, trajectories of secondary electrons are influenced and there is a possibility of failure to appropriately guide part of the secondary electrons out of the hole. Further, according to a predosing method using interlaced scanning such as described in Patent Literature 2, while some degree of the biasing of charging can be restrained in the predosed region, if, for example, there is a displacement between the center of the hole pattern and the center of the predosed region, charging is not symmetrical with reference to an axis extending in the Z-direction (the direction of passage of the electron beam) from the hole center and there is a possibility that trajectories of secondary electrons are influenced by the biased charging.

An electron beam scanning method and a scanning electron microscope with an objective to form an electric field for appropriately guiding electrons emitted from a pattern to be measured or inspected to the outside of the pattern are described below.

Solution to Problem

As one aspect to achieve the above-described objectives, there are proposed an electron beam irradiation method and a scanning electron microscope in which, a sample is irradiated with a first electron beam and charged and measurement or inspection of the sample is performed based on electrons obtained by scanning with a second electron beam to the charged sample, after irradiating the first electron beam to a first position and a second position which have a pattern center of a pattern formed on the sample as a point of symmetry, the first electron beam is irradiated further to two center points between the first and second irradiation positions on a same radius as the first and second positions with the point of symmetry as a center and further thereafter irradiation of the first electron beam to center points between positions already scanned on the radius is repeated.

Advantageous Effects of Invention

According to the above-described arrangement, limitation on bias of charging with respect to the center of the pattern is enabled and the efficiency of detection of electrons emitted from a bottom portion of a deep hole, a deep groove, or the like can be markedly improved.

BRIEF DESCRIPTION OF DRAWINGS

FIG. 9 contains diagrams for describing examples of electron beam scanning positions for predosing;

DESCRIPTION OF EMBODIMENTS

Figure 1:
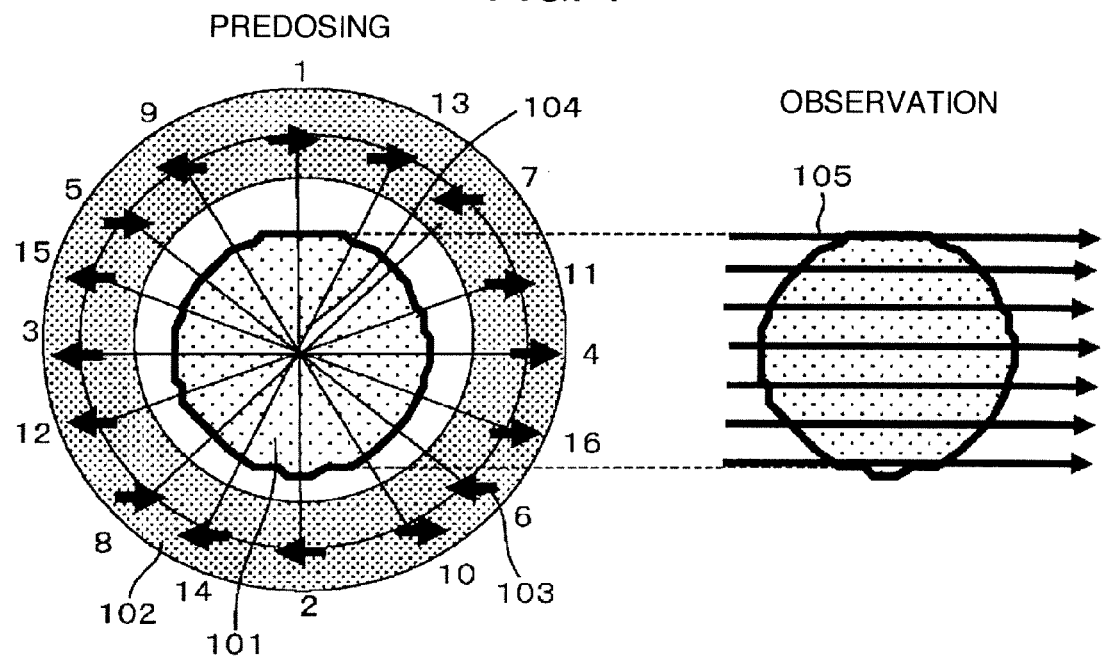
FIG. 1 is a diagram for describing an example of order of irradiation in a case where an electron beam is applied for predosing to a plurality of positions with a point of symmetry at a pattern center.

In embodiments described below, a scanning method and a scanning apparatus are described in which, to execute measurement or inspection of deep holes or the like having a high aspect ratio with high accuracy, a preliminary irradiation region for predosing is made axially symmetrical with a pattern to be measured or inspected as a center in particular, and the bias of charging in the preliminary irradiation region set axially symmetrical can be limited. Especially when the depth divided by the bottom diameter is large, there is a possibility of impingement on the side wall of irradiated electrons and secondary electrons emitted out from the hole bottom of the deep hole due to bias of a distribution of charging on the side wall such that the secondary electrons from the hole bottom cannot be observed. The signal from the hole bottom is thereby weakened, that is, the image cannot be seen. Further, there is also a possibility of the produced distribution of charge of the sample being changed in time due to scanning.

Hence, with the present embodiment, in a scanning electron microscope apparatus or the like including a charged particle optics column that directs a charged particle beam toward a surface of a substrate containing at least one hole, a detector that detects at least one charged particle among secondary charged particles, backscattered charged particles, and transmitted charged particles generated from surfaces including upper and bottom surfaces of the substrate, and a scanning deflector that scans the charged particle beam on the surface in a plural number of times, described mainly is a charged particle beam apparatus which, noticing a certain scanning position a, makes a scanning position b (a second scanning position) having the center of the hole as a point of symmetry (the center of symmetry) with respect to the scanning position a (a first scanning position) be the next scanning position, makes the center between the scanning position a and the scanning position b on the same radius as the scanning positions a and b as a third scanning position, and sets a fourth scanning position at a symmetrical position with respect to the third scanning position with the above-mentioned point of symmetry as the center. Further, an apparatus that executes predosing by repeating scanning to centers between positions already scanned on the same radius is described as well.

Also, by continuously performing scanning from the scanning position a to the scanning position b or from the scanning position b to the scanning position a (i.e., avoiding scanning to any other scanning position between the scans at the two scanning positions), a high degree of axial symmetry with a small influence of charge mitigation time can be secured. Incidentally, in terms of the third scanning position (the scanning position c) and the fourth scanning position (the scanning position d), the scanning position c and the scanning position d can be set at point-symmetry locations with the above-mentioned point of symmetry at the center on a straight line having the largest relative angle to the two straight lines connecting the centers of already-scanned scanning positions (e.g., the scanning position a and the scanning position b) and the hole center.

Additionally, in scanning at the respective above-described scanning positions, the scanning direction (the direction from a start point to an end point of the scan line) may be set from the hole center to an outside of the hole or from the outside of the hole to the hole center. Furthermore, in a case where signals of a plurality of frames are integrated, scanning for the plurality of frames may be performed while rotating the scanning direction by 90 degrees or 180 degrees for every frame or for a unit of a certain number of frames. Moreover, when the above-described scanning is performed, it is desirable to exclude the hole bottom and the side wall from the object to be scanned.

Besides, it is preferable that the position of the hole is specified in advance from design data of a chip which is a sample to be observed. It is also desirable to specify the hole position based on a measurement in advance before scanning.

Hereinafter, a method, an apparatus, a system, and a computer program (or a storage medium storing the computer program or a transmission medium through which the program is transmitted) that enable setting suitable predosing conditions are described with reference to the drawings. More specifically, an apparatus and a system which include a length-measuring scanning electron microscope (critical dimension-scanning electron microscope: CD-SEM), which is a kind of measuring apparatus, and a computer program implemented with them are described.

Figure 8:
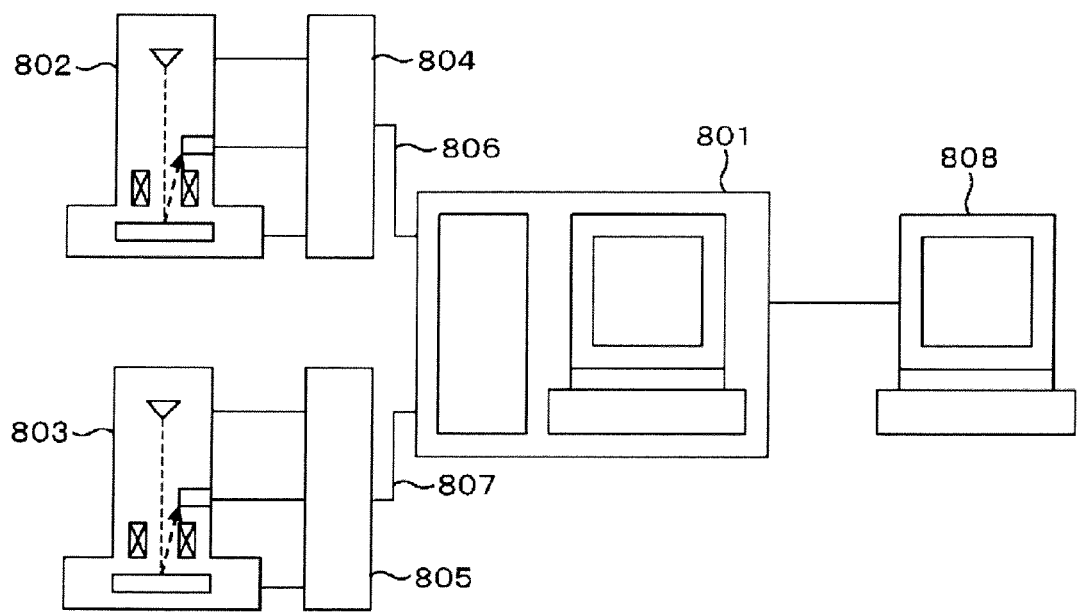
FIG. 8 is a diagram for describing an example of a measurement or inspection system including a plurality of SEMs.

FIG. 8 exemplifies a system in which a plurality of SEMs are connected with a data management device 801 at the center. In the present embodiment in particular, a SEM 802 is mainly for measuring or inspecting a pattern of a photomask or a reticle used in a semiconductor exposure process and a SEM 803 is mainly for measuring or inspecting a pattern transferred onto a semiconductor wafer by exposure using the above-described photomask or the like. The SEM 802 and the SEM 803 do not differ largely in basic configuration as an electron microscope from each other but are respectively constructed correspondingly to the difference in the sizes of the semiconductor wafer and the photomask and the difference in resistance to charging.

To the SEM 802 and the SEM 803 their controllers 804 and 805 are respectively connected and control necessary for the SEMs is performed. In each SEM, a beam of electrons emitted from an electron source is converged by lens in a plurality of stages, and with a scanning deflector the converged electron beam is scanned on a sample one-dimensionally or two-dimensionally.

Secondary electrons (SEs) or backscattered electrons (BSEs) emitted from the sample by scanning with the electron beam are detected by a detector and are stored in a storage medium such as a frame memory in synchronization with scanning of the scanning deflector. Integrated image signals for a plurality of frames are stored in the frame memory. Scanning with the scanning deflector can be performed with respect to any size, position, and direction so that scanning for forming an image described below and selective scanning on an edge portion are enabled.

Control such as described above is performed by each of the controllers 804 and 805 for each of the SEMs and images and signals obtained as a result of scanning with electron beams are sent to the data management device 801 through communication lines 806 and 807. Incidentally, although the present embodiment is described with the controllers for controlling the SEMs and the data management device that performs measurement based on the signals obtained by the SEMs separate from each other, it is not limited thereto; at the data management device both control of the apparatus and measuring processing may be performed at once, or each controller may perform both control of the SEM and measuring processing. Also, beam irradiation conditions or the like may be stored on an external storage medium and the controllers may be configured so as to be able to access the storage medium.

Also, in a computer in the above-described data management device, the controller, or the like, a program for execution of measuring processing is stored and measurement or computation according to the program is performed. The program is stored in a computer-readable recording medium. Further, in the design data management device design data of photomasks (referred simply as "mask" in some case below) and wafers used in a semiconductor manufacturing process are stored. These design data are expressed, for example, in the GDS format, the OASIS format, or the like and are stored in a predetermined format. Incidentally, a kind of design data is not questioned as long as the software which displays the design data can display the type of its format and treat as figure data. Also, the design data may be stored on a storage medium provided separately from the data management device.

Besides, a simulator 808 is connected to the data management device 801. In the simulator 808, design data stored in an external storage medium or in the data management device 901, a program for making a pattern layout based on semiconductor manufacturing process conditions or the like, and a computation device that executes it are incorporated, and it is configured so as to be able to transmit layout data after the simulation to the data management device. Incidentally, in the present embodiment, an example in which a simulation is performed in the simulator 908; it is not limited thereto and, for example, the above-described program may be executed in the data management device 808 so that a simulation is performed.

Further, the data management device 801 is equipped with a function to create a program (recipe) for controlling the operation of an SEM based on semiconductor design data, and it functions as a recipe setting section. Specifically, it sets positions to perform necessary processings for an SEM such as the desired measuring points, automatic focusing, automatic astigmatism, and addressing points on design data, pattern contour line data, or simulated design data, and creates a program for automatically controlling the sample stage, the deflector, and the like of the SEM based on the settings. That is, the data management device 801 and the controller 805 function as measurement condition setting devices.

Figure 7:
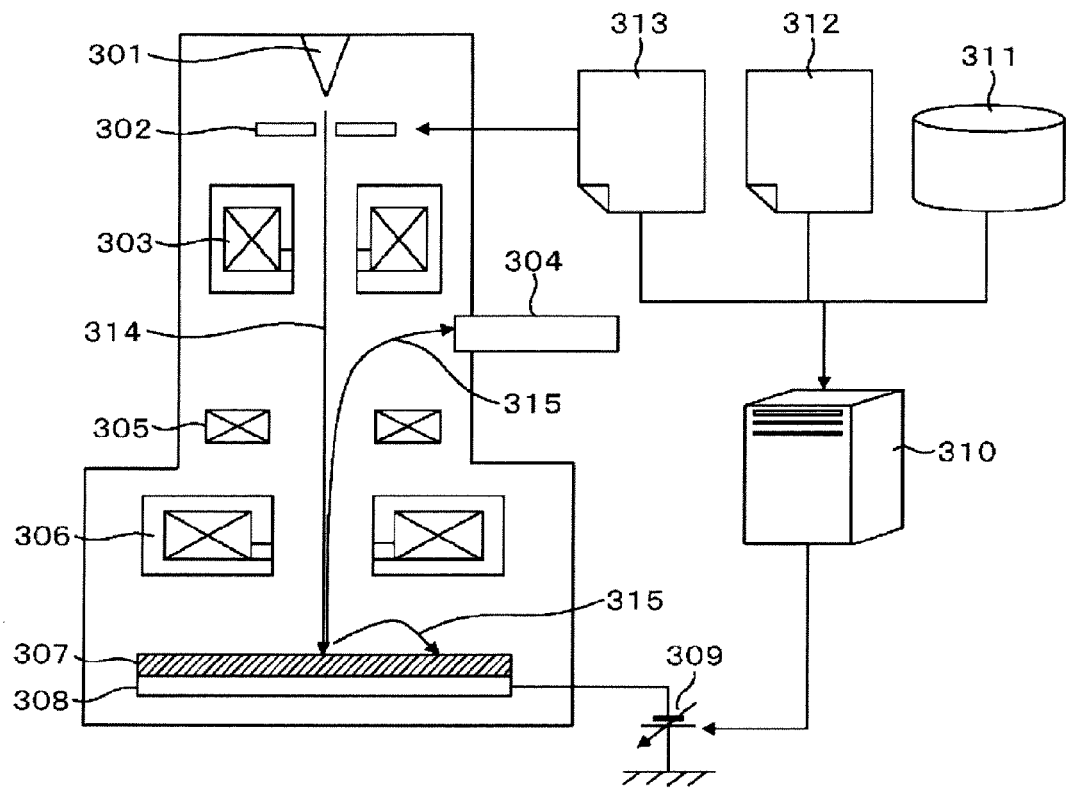
FIG. 7 is a diagram schematically describing a scanning electron microscope.

FIG. 7 is a schematic configuration diagram of the scanning electron microscope. Electrons emitted from an electron source 301 are accelerated by an accelerating electrode 302, the accelerated electron beam 314 is focused by a condenser lens 303, which is a form of a focusing lens, and is thereafter scanned one-dimensionally or two-dimensionally on a sample 307 by a scanning deflector 305. The electron beam 314 is decelerated by a negative voltage power supply 309 applied to an electrode incorporated in a sample table 308 and is converged by the lens effect of an objective lens 306 to be irradiated onto the sample 307. The sample 307 is arranged in a sample chamber in which a vacuum atmosphere is maintained.

When the electron beam 314 is irradiated to the sample 307, electrons 315 such as secondary electrons and backscattered electrons are emitted from the irradiated position. Emitted electrons 315 are accelerated toward the electron source by the accelerating effect based on the negative voltage applied to the sample and are captured by a detector 304; an output of the detector 304 changes according to the amount of captured secondary electrons. The luminance of a not-illustrated display changes according to this output. For example, in a case where a two-dimensional image is formed, a deflection signal to the scanning deflector 305 and the output of the detector 304 are synchronized with each other, thereby forming an image of the scanning area. The scanning electron microscope exemplified in FIG. 7 is also provided with a deflector (not shown) that moves the electron beam scanning area. This deflector is used for forming images or the like of patterns of the same shape existing at different positions. This deflector is also called as an image-shifting deflector and enables moving the position of the field of view (FOV) of the electron microscope without moving the sample on the sample stage. Moreover, the image-shifting deflector and the scanning deflector may be made one common deflector and a signal for image shifting and a signal for scanning may be superimposed on each other and supplied to the deflector.

Incidentally, the scanning electron microscope exemplified in FIG. 7 is provided with a storage medium which stores device specification data 312 storing device specifications of the respective components of the scanning electron microscope and scanning condition data 312 storing device conditions. Such a storage medium may be incorporated in the controllers 804 and 805 for scanning electron microscopes exemplified in FIG. 8, or it may be stored in a different storage medium that can be accessed from the scanning electron microscopes. Further, a sample surface potential estimator 310 exemplified in FIG. 7 controls the negative voltage (retarding voltage) applied to the sample.

Each of the controllers 804 and 805 controls the components of the scanning electron microscope and has a function to form an image based on detected electrons and a function to measure a pattern width of a pattern formed on the sample based on a distribution of intensity of detected electrons, which is called a line profile. Also, to realize partial electron beam irradiation on the sample described below, each of the controllers 804 and 805 supplies a signal to the scanning deflector 305 and controls the scanning deflector 305 so that electron beam irradiation to any position can be performed.

In each of the controllers 804 and 805, a storage medium storing a recipe in which conditions for a first electron beam for charging a region on which pattern measurement or forming of an image for inspection is to be performed and beam conditions for a second electron beam for forming an image are written is incorporated. The scanning electron microscope controls landing energies of the electron beam onto the sample, the beam current, and/or the magnification according to the conditions stored in the storage medium. Each of these beam conditions is for controlling sample charging; sample charging and respective beam conditions (landing energies, beam currents, magnifications, combinations of two or more of these conditions, or the like) may be stored in the storage medium in advance and may read out these conditions to set based on designation of a predosing condition.

Embodiment 1

A scanning method that is axially symmetric (with a pattern center as the center) with respect to a pattern to be measured or inspected and can prevent the bias of charging is described next with reference to FIGS. 1 and 2.

Figure 2:
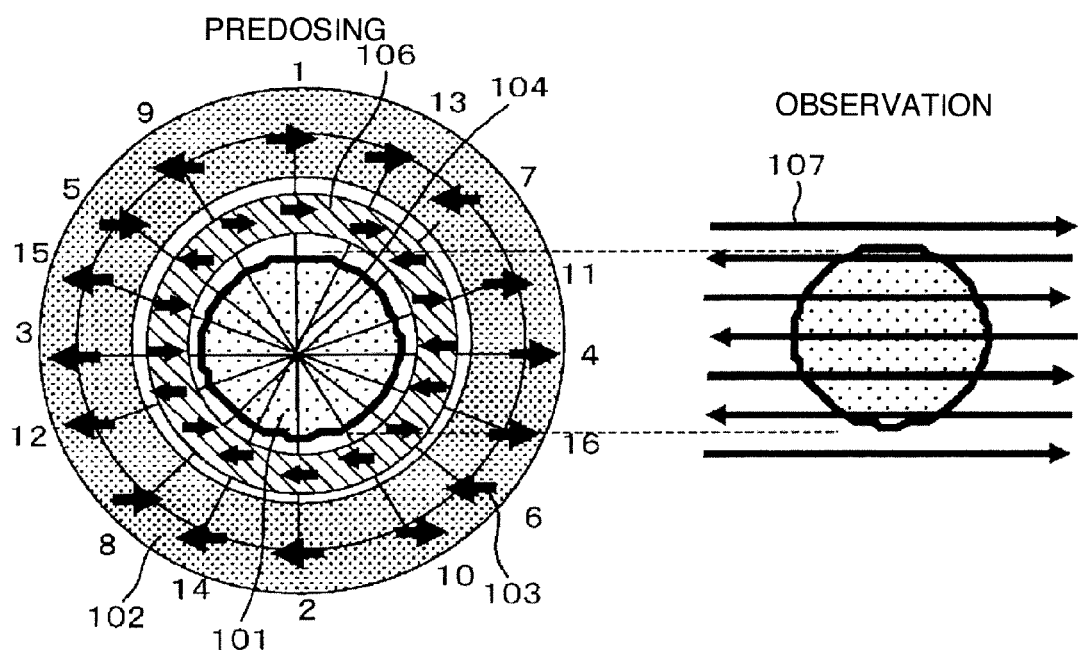
FIG. 2 is a diagram for describing another example of order of irradiation in a case where an electron beam is applied for predosing to a plurality of positions with a point of symmetry at a pattern center.

Referring to FIG. 1, high-energy primary electrons are first scanned axially symmetrically about a hole center 104 to positively charge a predosed region 102 around a hole 101. Scans 103 are made in order of 1 to 2 to 3 to 4 to 5 to 6 to 7 to 8 to 9 to 10 to 11 to 12 to 13 to 14 to 15 to 16. Since with respect to scans 1, 3, 5, 7, 9, 11, 13, and 15 there are scans 2, 4, 6, 8, 10, 12, 14, and 16 which are axisymmetric about the hole center, the distribution of charging in the predosed region becomes axially symmetrical. Also, because the scans 1 to 2, 3 to 4, 5 to 6, 7 to 8, 9 to 10, 11 to 12, 13 to 14, and 15 to 16 are made continuous with respect to time, changes in the distribution of charging with respect to time are also axially symmetrical, the distribution of charging in the predosed region is improved and becomes axial symmetrical. In predosing by raster scanning, the scanning line is successively moved from the top to the bottom of the predosed region, which could cause variations in charge mitigation time in the predosed region, and there is a possibility to generate bias of charging in the surface of the predosed region; with the above-described scanning method, however, it becomes possible to prevent such biasing.

Further, in the present scanning method the hole and the hole side wall are not scanned with electrons so that the amount of charging in the side wall surface is reduced and primary electrons and secondary electrons from the hole bottom are not subjected to be caught by the side wall. In other words, the potential difference between the hole bottom and the sample surface can be increased as not irradiating the hole bottom with the beam for charging, thereby improving the effect of pulling up secondary electrons. Further, if a scanning position c and a scanning position d which are axially symmetrical about the hole center are further made, a center line of the two lines having the largest angle formed therebetween among any two adjacent lines which connect the centers of the scanning lines already been scanned and the hole center is made correspond to the axial symmetry line between the scanning positions c and d.

Incidentally, in the present embodiment, a scanning position with the hole center of a hole a point of symmetry (the center of symmetry) is determined as the next scanning position (e.g., the scanning position 2 with respect to the scanning position 1, or the scanning position 4 with respect to the scanning position 3), and the next scanning positions are set on the same radius as the positions scanned already and at centers between the positions already scanned (e.g., the scanning positions 3 and 4 with respect to the scanning positions 1 and 2). Further, by repeating scanning to the centers between the positions already scanned a predetermined number of scans are completed. In the present embodiment (c, d)=(3, 4), (5, 6), (7, 8), (9, 10), (11, 12), (13, 14), and (15, 16) correspond. By this, the distribution of charging in the plane is made uniform and the distribution of charging in the predosed region becomes axisymmetric.

The hole is observed by raster scans 105 after executing predosing in the above-described way. Also referring to FIG. 2, the predosed region 102 is divided into two doughnut regions 105 and 106. After scanning within one doughnut region, the other doughnut region is scanned. By this, the uniformity of the distribution of charging along the circumferential direction of the predosing is improved and the distribution of charging in the predosed region is further improved in the axial symmetry. By performing scanning (the scanning line 107) according to the method of repeating scanning to center positions between lines of scanning already performed after executing predosing in the above-described way, image acquisition or execution of inspection or measurement is carried out.

As described above, since the distribution of charging on the side wall can be made axially symmetrical, secondary electrons from the hole bottom become less easily captured by the side wall, and the signal intensity of secondary electrons emitted from the hole bottom is enhanced.

FIG. 9 contains diagrams for describing various modes of setting a plurality of predosed regions on the same radius. Incidentally, although examples of rectangular scanning on each of predosed regions 901 are described in the present examples, it is not limited thereto; for example, by irradiating a beam of a large beam diameter to the respective predosed regions in the above-described order, predosing that has been described in the present embodiment may be executed. A shape of the scanned area may be in an arbitrary shape if there is no particular problem with it.

FIG. 9(a) is a diagram for describing an example in which predosed regions are positioned on the same radius 902 with a hole center as the center. FIG. 9(b) is a diagram for describing an example of setting a region of the same radius 903 and positioning a plurality of predosed regions 901 in the region. In general, since hole patterns are often circular, it is desirable to arrange predosed regions 901 in a circular shape as the hole to surround the hole; however, the present method is effective, which enables securing a degree of freedom of arrangement of predosed regions in order to deal with cases such as where a region relatively easily charging or a pattern vulnerable to irradiation with the electron beam exists nearby and it is not desirable to irradiate the electron beam to this portion. In the case of the example of FIG. 9(b), each adjacent pair of the predosed regions are different in distances from the hole center; however, since the predosed regions having a short distance from the hole center and the predosed regions having a long distance from the hole center are alternately placed and the distances from the hole center to predosed regions opposing with respect to the hole center are set equal to each other, a balance of the potential centered at the hole is maintained.

Embodiment 2

Figure 3:
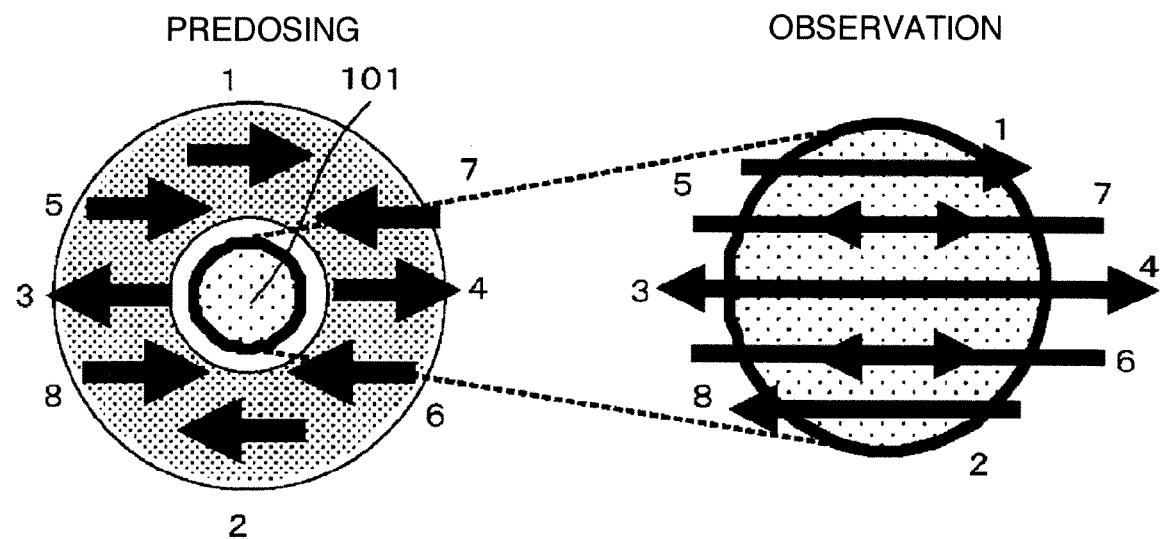
FIG. 3 is a diagram for describing an example of order of irradiation and directions of scanning with an electron beam for predosing.

FIG. 3 is a diagram for describing a second embodiment in terms of predosing scanning. Referring to FIG. 3, the order of predosing scans is 1 to 2 to 3 to 4 to 5 to 6 to 7 to 8, and side wall charging is axially symmetrical, as is that in Embodiment 1. Further, the order and the direction of scans for observation coincides with those of the predosing scans. Thus, not only the predosing scans but also scans at the time of observation are made axially symmetrical and the distribution of charging on the side wall is further improved in its axial symmetry; therefore, secondary electrons from the hole bottom become less easily captured by the side wall and the signal intensity of secondary electrons from the hole bottom is enhanced.

Embodiment 3

Figure 4:
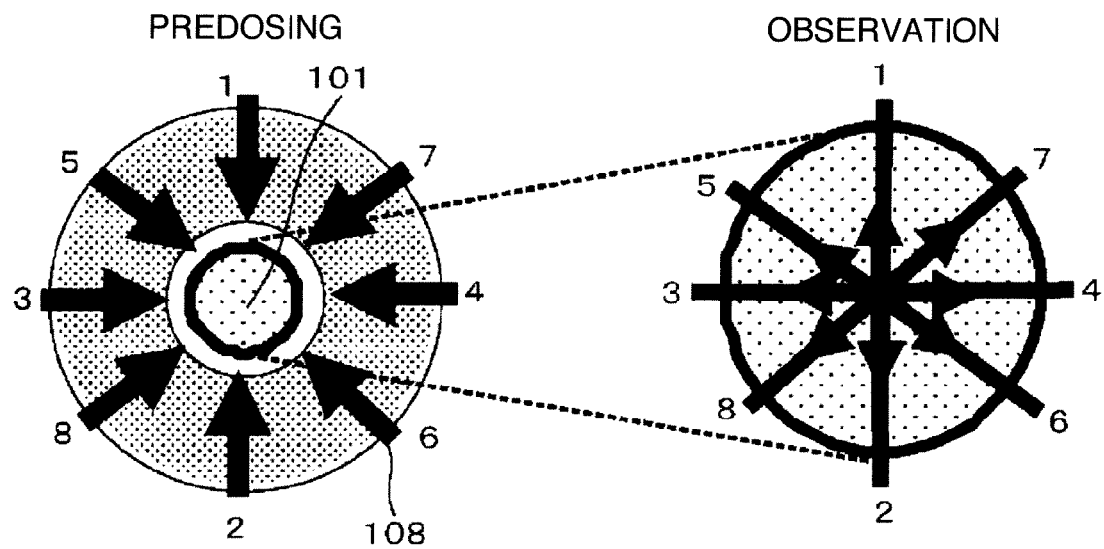
FIG. 4 is a diagram for describing another example of order of irradiation and directions of scanning with an electron beam for predosing.

FIG. 4 is a diagram for describing a third embodiment in terms of predosing scanning. Referring to FIG. 4, the order of predosing scans is 1 to 2 to 3 to 4 to 5 to 6 to 7 to 8, and side wall charging is axially symmetrical, as is that in Embodiment 1. Further, the order and the direction of scans for observation coincide with those of the predosing scans. Furthermore, scanning directions 108 are directed toward the hole center, so that the scans per se are axially symmetrical. Thus, since the scans themselves are made axially symmetrical, the predosing scans and the distribution of charging on the scanned side wall at the time of observation can be improved in axial symmetry; therefore, as secondary electrons from the hole bottom become less easily captured by the side wall, the signal intensity of secondary electrons from the hole bottom is enhanced.

Embodiment 4

Figure 5:
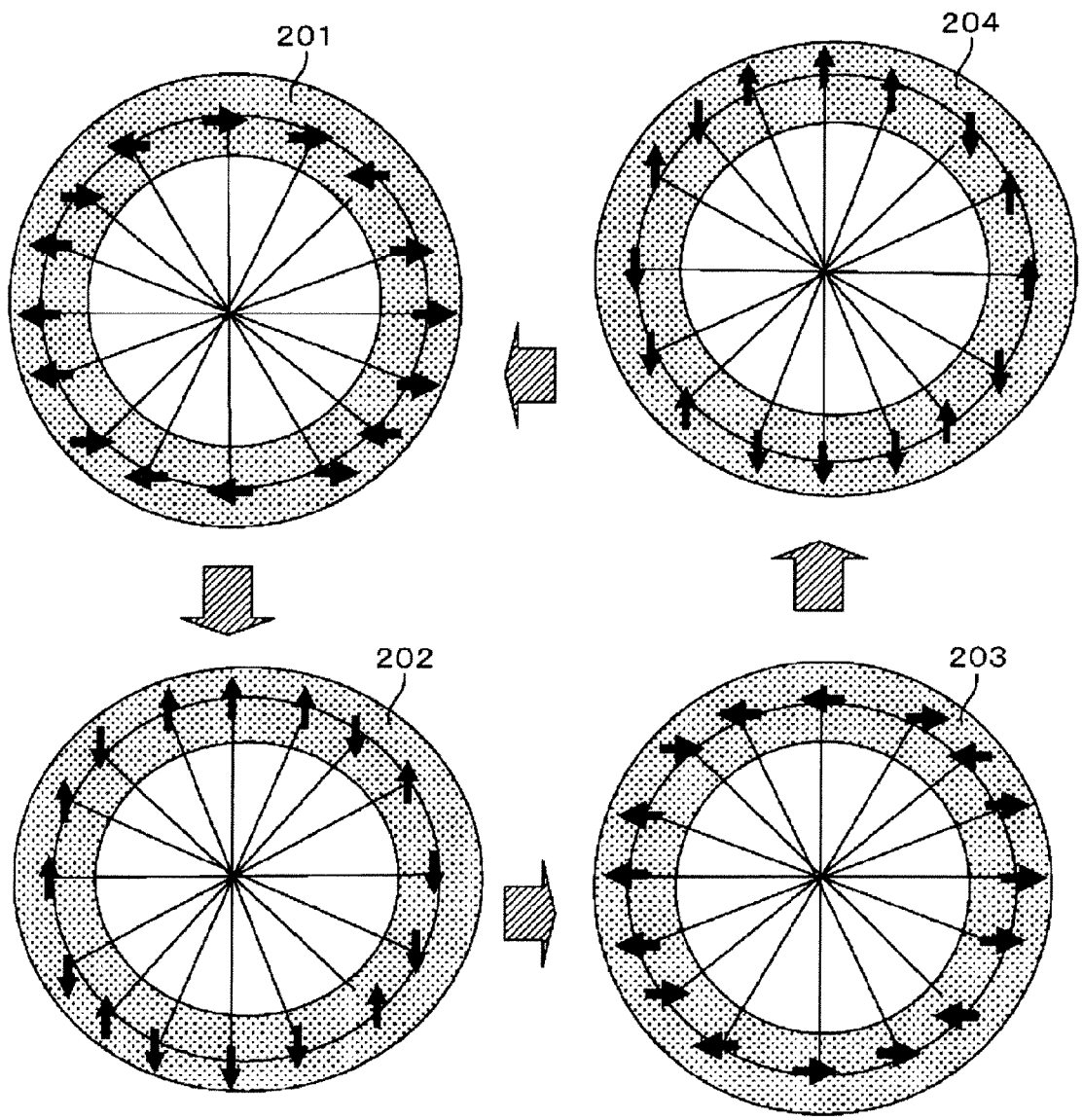
FIG. 5 is a diagram for describing still another example of order of irradiation and directions of scanning with an electron beam for predosing.

FIG. 5 is a diagram for describing a fourth embodiment in terms of predosing scanning. Referring to FIG. 5, in a first frame 201 scanning is executed on the same predosed region as that shown in FIG. 1, and the direction of scanning is rotated clockwise by 90 degrees in the next frame 202. The direction of scanning is further rotated clockwise by 90 degrees in the next frame 203. It is also rotated clockwise by 90 degrees in the next frame 204. When it is rotated clockwise by 90 degrees for the next frame, it would be back to the original. This is repeated until all frames are completed. The number of frames is preferably a multiple of 4. By rotating the scanning direction by 90 degrees in every frame in this way, the axial symmetry of scanning itself can be further improved as in the present embodiment.

Further, by also rotating the order of scanning by 90 degrees, the axial symmetry of the distribution of charging in the predosed region can be further improved. Thus, the distribution of charging on the side wall can be made axially symmetrical; since secondary electrons from the hole bottom become less easily captured by the side wall, the signal intensity of secondary electrons from the hole bottom is enhanced.

Embodiment 5

Figure 6:
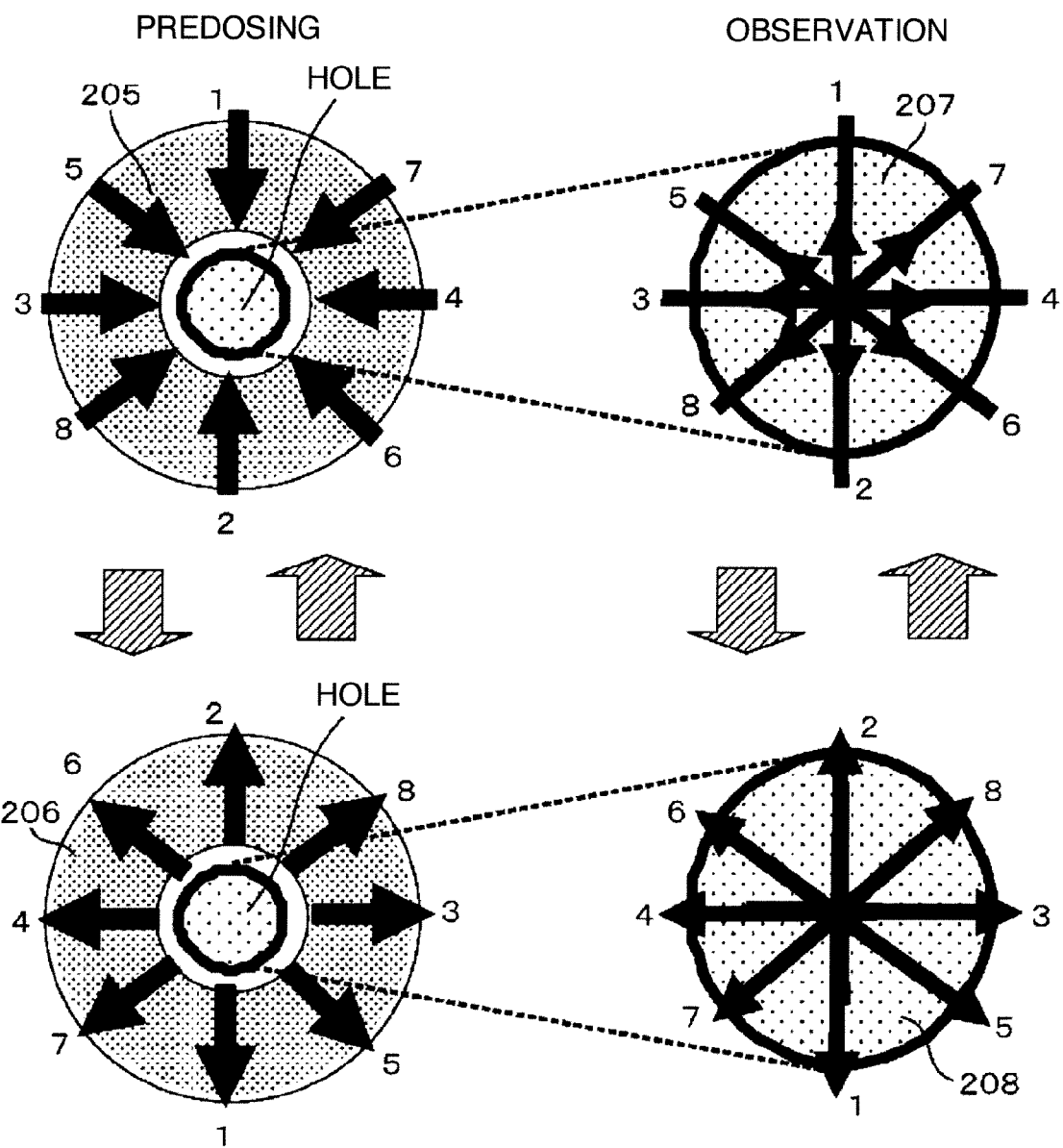
FIG. 6 is a diagram for describing a further example of order of irradiation and directions of scanning with an electron beam for predosing.

FIG. 6 is a diagram for describing a fifth embodiment in terms of predosing scanning. Referring to FIG. 6, in a first frame 205 scanning is executed on the same predosed region as that shown in FIG. 4, and the direction of scanning is rotated by 180 degrees in the next frame 206. It is further rotated by 180 degrees in the next frame. With this it would be back to the original scanning. This is repeated until all frames are completed. The number of frames is preferably a multiple of 2. By rotating the scanning direction by 180 degrees in every frame in this way, the axial symmetry of scanning itself can be improved as in the present embodiment.

Further, by also rotating the order of scanning by 180 degrees, the axial symmetry of the distribution of charging in the predosed region can be improved. Thus, the distribution of charging on the side wall can be made axially symmetrical; since secondary electrons from the hole bottom becomes less easily captured by the side wall, the signal intensity of secondary electrons from the hole bottom is enhanced.

In the present embodiment, rotation of the scanning direction and change of the scanning order with respect to the beam for observation are also performed in the same way as for predosing (frames 207 and 208). By performing such scanning at the time of observation as well, observation can be executed while maintaining the axial symmetry of the distribution of charging.

Embodiment 6

A sixth embodiment is described next in terms of predosing scanning. As exemplified in FIG. 7, the above-described scanning electron microscope has a storage medium for storing device specification data 312 such as the distance between the objective lens 306 and the sample 307 and scanning condition data 312 comprising conditions set by a user such as an acceleration voltage and a magnification, and also has a storage medium for storing design data 311 in which physical properties such as the dielectric constants and conductivities of samples to be measured and pattern layout data are recorded. The design data may be stored in an external storage medium and accessed when necessary.

In the apparatus of the present embodiment it is configured so that these pieces of information are input to the sample surface potential estimator 310 and the negative voltage power supply 309 is adjusted based on estimated values therefrom. In the sample surface potential estimator 310, calculation of trajectories of charged particles and calculation of potentials after charging are mainly executed. Charged particles receive the Lorentz force in an electromagnetic field. Therefore, for example, for primary electrons, trajectories from the electron source 301 to the sample 307 and the positions and the velocities at which the primary electrons impinge on the sample 307 can be calculated by obtaining the initial velocity of the charged particles and the magnitudes of the electric and magnetic fields in the measurement space from the design data 311, the device specification data 312, and the scanning condition data 313.

Besides, the primary electrons having impinged on the sample 307 are scattered in the sample 307 and cause secondary electrons 315 and the like to be emitted. Here, from the design data 311 on the chip, which is the sample to be observed, the position of a hole in the wafer can be determined in advance and a scanning method can be determined.

Further, by specifying the position of a hole in advance in a different measurement before scanning execution of axially symmetric scanning is possible even if the hole is not formed as designed. Because the hole center position does not deviate from the actual position as described above, the distribution of charging on the side wall can be made axially symmetrical and, since secondary electrons from the hole bottom becomes less easily captured by the side wall, the signal intensity of secondary electrons from the hole bottom is enhanced.

Embodiment 7

Figure 10:
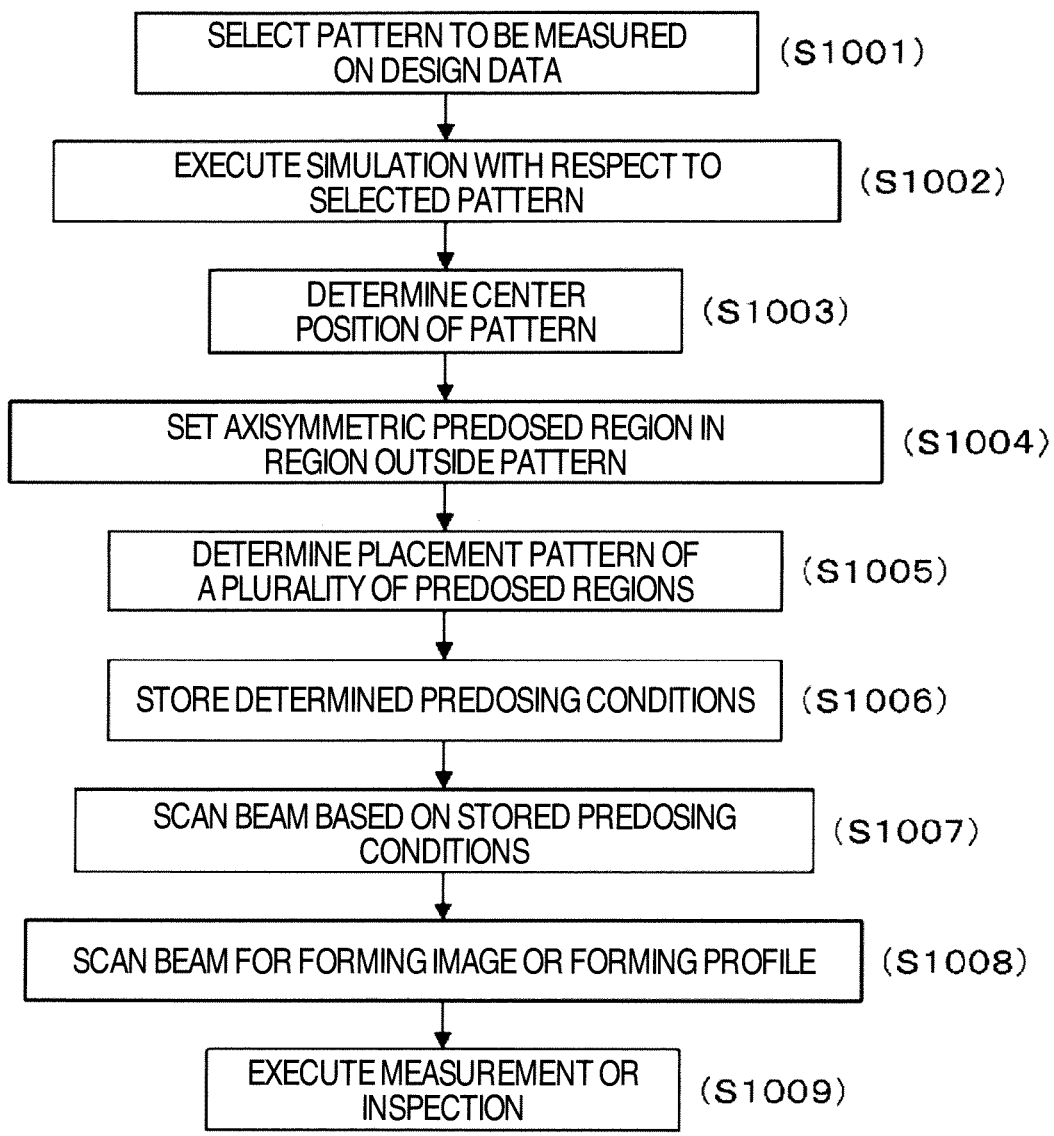
FIG. 10 is a flowchart for describing a process of determining predosing conditions based on designation of a pattern to be measured on design data.

FIG. 10 is a flowchart for describing a process of determining measurement conditions based on design data of a semiconductor device. A pattern to be measured is first selected on the design data (Step 1001). The design data is stored in advance in an external storage medium or a storage medium provided in the scanning electron microscope apparatus. Next, a simulation using process parameters and the like is executed with respect to the pattern selected as an object to be measured (Step 1002). The simulation may be executed using the external simulator 808 or by the computation device provided in the scanning electron microscope apparatus. For the simulation method itself, one already existing can be used. There is a possibility for the pattern to be farmed on the semiconductor device to be formed in a shape different from the design data (layout data) depending on manufacturing conditions or the like. On the other hand, if the center of a predosed region deviates from the pattern center, there is a possibility that secondary electron trajectories are deflected.

In the present embodiment, therefore, the real pattern shape is predicted with a simulation and the pattern center is specified based on the predicted shape. For specifying the center position (Step 1003), an existing method such as a method of performing fitting between the shape obtained by the simulation and a dictionary pattern shape registered in advance and specifying the pattern center based on the center position information that the dictionary pattern has or obtaining the center based on the curvature of the pattern can be used. Next, a predosed region centered at the pattern center specified in Step 1003 and excluded with the pattern region is set (Step 1004). If it is a hole pattern, it is desirable to set a predosed region on the same radius from the hole center. Next, a plurality of scanning positions are set along the determined predosed region (Step 1005). This setting may be such that an operator places at arbitrary positions (on condition such that the plurality of scanning positions are placed axially symmetrically) on a GUI screen, or a pattern registered in advance is used. Incidentally, if the pattern of the predosed region and a placement pattern of a plurality of scanning positions are stored in association with each other in advance, this step is not necessary.

The predosing conditions determined as above are stored in a prescribed storage medium, thereby completing the predosing condition determination process (Step 1006). The predosing conditions are stored as a measurement recipe for the scanning electron microscope.

Predosing (Step 1007) is performed based on the recipe set as above and, after charging is attached to the sample surface, beam scanning for forming an image or forming a profile is performed (Step 1008). By executing measurement or inspection based on the appropriate predosing described above (Step 1009), improving the efficiency of detection of electrons emitted from the hole bottom can be made.

Figure 11:
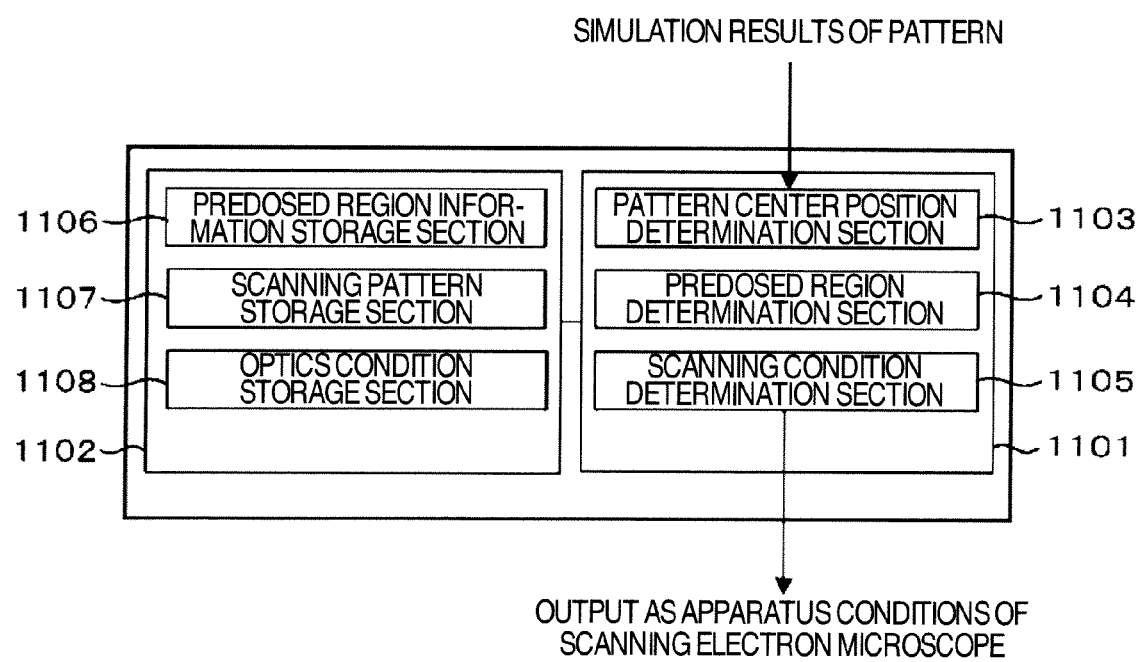
FIG. 11 is a diagram for describing an example of a control processor that determines predosing conditions.

FIG. 11 is a diagram for describing an outline of a control processor for determining predosing conditions, incorporated in the controllers 804 and 805 or the data management device 801. The control processor includes a computation section 1101 and a storage section 1102 and in the computation section 1101 the simulator 808 or a pattern center position determination section 1103 that specifies a center position of pattern data obtained from design data are included. Also in the storage section 1102 a predosed region information storage section 1106 is provided so that information such as the distance between the pattern data obtained and a predosed region and the size and the shape of the predosed region is stored. Since it is desirable to scan with the hole bottom and the side wall excluded from the object to be predosed, as described above, it is desirable to set information on predosed regions such that a predosed region is set outside a pattern contour line formed based on design data or a simulation.

A predosed region determination section 1104 determines a predosed region with a pattern center as the center based on the region information stored in the predosed region information storage section 1106. Further, in a scanning pattern storage section 1107 information on a plurality of scanning positions according to the predosed region information stored in the predosed region information storage section 1106 and information on scanning patterns are stored and in a scanning condition determination section 1105 scanning positions and a scanning pattern are determined based on the stored information. In an optics condition storage section 1108, optics conditions such as a beam current, a magnification (a size of an area to be scanned), landing energies of the beam onto the sample, and beam convergence conditions at the time of predosing are stored. The scanning condition determination section 1105 determines beam conditions based on the information stored in the optics condition storage section 1108 and outputs as apparatus conditions of the scanning electron microscope.

With the above-described configuration, determination of appropriate beam conditions according to the state of formation of a pattern becomes possible.

REFERENCE SIGNS LIST

301 electron source
302 accelerating electrode
303 condenser lens
304 detector
305 scanning deflector
306 objective lens
307 sample
308 sample table
309 negative voltage power supply

The invention claimed is:

1. An electron beam irradiation method in which a sample is irradiated with a first electron beam and charged and measurement or inspection of the sample is performed based on electrons obtained by scanning with a second electron beam to the charged sample, the method comprising the steps of:
   irradiating the first electron beam to a first position and a second position, the first position and the second position being symmetrically arranged with a pattern center of a hole pattern formed on the sample as a point of symmetry, the first position and the second position being arranged outside the hole pattern;
   after then, irradiating further the first electron beam to two middle positions located between the first and second positions already irradiated by the first electron beam, and on a circumference of a circle defined by the first and second positions with the point of symmetry as a center of the circle; and
   further thereafter repeating irradiations of the first electron beam to middle positions on the circumference of the circle between positions already scanned by the first electron beam in a manner that the first electron beam is deflected so as to be selectively irradiated on an area outside the hole pattern.

2. The electron beam irradiation method according to claim 1, wherein the first electron beam is irradiated excluding an inner region defined by a circumferential edge of the hole pattern.

3. The electron beam irradiation method according to claim 1, wherein two irradiations of the first electron beam to two positions, which are arranged symmetrically on the circumference of the circle as the pattern center of the hole pattern as a point of symmetry, is continuously performed without irradiating an electron beam to other positions between the two irradiations.

4. The electron beam irradiation method according to claim 1, wherein a scanning direction is changed between the first position and the second position during irradiation of the first electron beam by 90 degrees or 180 degrees.

5. The electron beam irradiation method according to claim 1, wherein the first electron beam is scanned from an outside of the hole pattern toward the pattern center or from the pattern center toward the outside of the hole pattern.

6. A scanning electron microscope comprising:
   an electron source;
   a lens that converges an electron beam emitted from the electron source, and
   a deflector that deflects an irradiation position of an electron beam, the deflector comprising
     a controller that controls the deflector, the controller controlling the deflector so that a sample is irradiated with a first electron beam to charge a sample and scanning of a second electron beam onto the charged sample is performed, wherein:
   the controller controls the deflector so that:
     the first electron beam is irradiated to a first position and a second position, the first position and the second position being symmetrically arranged with a pattern center of a hole pattern formed on the sample as a point of symmetry, the first position and the second position being arranged outside the hole pattern,
     the first electron beam is further irradiated after then to two middle positions located between the first and second positions already irradiated by the first electron beam, and on a circumference of a circle defined by the first and second positions with the point of symmetry as a center, and irradiations of the first electron beam to middle positions on the circumference of the circle between positions already scanned by the first electron beam is thereafter repeated further in a manner that the first electron beam is deflected so as to be selectively irradiated on an area outside the hole pattern.

7. The scanning electron microscope according to claim 6, wherein the controller controls the deflector so that the first beam is irradiated excluding an inner region defined by a circumferential edge of the hole pattern as a closed figure.

8. The scanning electron microscope according to claim 6, wherein the controller controls the deflector so that two irradiations of the first electron beam to two positions, which are arranged symmetrically on the circumference of the circle as the pattern center of the hole pattern as a point of symmetry, is continuously performed without irradiating an electron beam to other positions between the two irradiations.

9. The scanning electron microscope according to claim 6, wherein the controller controls the deflector so that a scanning direction is changed between the first position and the second position during irradiation of the first electron beam 90 degrees or 180 degrees.

10. The scanning electron microscope according to claim 6, wherein the controller controls the deflector so that the first electron beam is scanned from an outside of the hole pattern toward the pattern center or from the pattern center toward the outside of the hole pattern.

* * * * *